(12) United States Patent
Harman

(10) Patent No.: US 7,287,580 B2
(45) Date of Patent: Oct. 30, 2007

(54) HEAT EXCHANGER

(75) Inventor: Jayden David Harman, San Rafael, CA (US)

(73) Assignee: Pax Scientific, Inc., San Rafael, CA (US)

( * ) Notice: Subject to any disclaimer, the term of this patent is extended or adjusted under 35 U.S.C. 154(b) by 0 days.

(21) Appl. No.: 11/484,123

(22) Filed: Jul. 10, 2006

(65) Prior Publication Data

US 2006/0249283 A1    Nov. 9, 2006

Related U.S. Application Data

(63) Continuation of application No. 10/884,713, filed on Jul. 1, 2004, now Pat. No. 7,096,934, which is a continuation of application No. PCT/AU03/00006, filed on Jan. 3, 2003.

(30) Foreign Application Priority Data

Jan. 3, 2002    (AU)    .................... PR9825

(51) Int. Cl.
F28F 13/06    (2006.01)
(52) U.S. Cl. .............. 165/177; 165/184; 165/80.3
(58) Field of Classification Search ........... 165/177, 165/184, 80.1–80.3
See application file for complete search history.

(56) References Cited

U.S. PATENT DOCUMENTS

| | | |
|---|---|---|
| 871,825 A | 11/1907 | Schupmann |
| 1,785,460 A | 12/1930 | Schlotter |
| 1,799,039 A | 3/1931 | Conejos |
| 1,919,250 A | 7/1933 | Olson |
| 2,165,808 A | 7/1939 | Murphy |
| 3,076,480 A | 2/1963 | Vicard |
| 3,081,826 A | 3/1963 | Loiseau |
| 3,082,695 A | 3/1963 | Buschhorn |
| 3,215,165 A | 11/1965 | Broadway |
| 3,692,422 A | 9/1972 | Girardier |
| 3,940,060 A | 2/1976 | Viets |
| 3,964,841 A | 6/1976 | Strycek |
| 4,206,783 A | 6/1980 | Brombach |
| 4,211,183 A | 7/1980 | Hoult |
| 4,225,102 A | 9/1980 | Frosch et al. |

(Continued)

FOREIGN PATENT DOCUMENTS

AU    B-62946/96    2/1997

(Continued)

OTHER PUBLICATIONS

Derwent Abstract Accession No. 97-198067/18, JP 09053787 A (Kajima Corp) Feb. 25, 1997.

(Continued)

*Primary Examiner*—Teresa J. Walberg
(74) *Attorney, Agent, or Firm*—Carr & Ferrell LLP

(57) ABSTRACT

A heat exchanger having an active surface over which a fluid flows to affect an exchange of heat between the active surface and the fluid. In some embodiments, the active surface includes a logarithmic spiral wherein the radius of the logarithmic spiral measured at equiangular radii unfolds at a constant order of growth. Further embodiments exhibit an active surface conforming to the internal or external surface of particular class or genera of shells.

16 Claims, 11 Drawing Sheets

U.S. PATENT DOCUMENTS

| | | | |
|---|---|---|---|
| 4,299,553 | A | 11/1981 | Swaroop |
| 4,505,297 | A | 3/1985 | Leech et al. |
| 4,540,334 | A | 9/1985 | Stähle |
| 4,679,621 | A | 7/1987 | Michele |
| 4,699,340 | A | 10/1987 | Rethorst |
| 4,834,142 | A | 5/1989 | Johannessen |
| 4,993,487 | A | 2/1991 | Niggemann |
| 4,996,924 | A | 3/1991 | McClain |
| 5,010,910 | A | 4/1991 | Hickey |
| 5,040,558 | A | 8/1991 | Hickey et al. |
| 5,052,442 | A | 10/1991 | Johannessen |
| 5,058,837 | A | 10/1991 | Wheeler |
| 5,100,242 | A | 3/1992 | Latto |
| 5,139,215 | A | 8/1992 | Peckham |
| 5,181,537 | A | 1/1993 | Powers |
| 5,207,397 | A | 5/1993 | Ng et al. |
| 5,220,955 | A | 6/1993 | Stokes |
| 5,249,993 | A | 10/1993 | Martin |
| 5,312,224 | A | 5/1994 | Batchelder et al. |
| 5,337,789 | A | 8/1994 | Cook |
| 5,382,092 | A | 1/1995 | Okamoto et al. |
| 5,661,638 | A | 8/1997 | Mira |
| 5,741,118 | A | 4/1998 | Shinbara et al. |
| 5,787,974 | A | 8/1998 | Pennington |
| 5,891,148 | A | 4/1999 | Deckner |
| 5,934,612 | A | 8/1999 | Gerhardt |
| 5,934,877 | A | 8/1999 | Harman |
| 5,954,124 | A | 9/1999 | Moribe et al. |
| 6,050,772 | A | 4/2000 | Hatakeyama et al. |
| 6,374,858 | B1 | 4/2002 | Hides et al. |
| 6,623,838 | B1 | 9/2003 | Nomura et al. |
| 6,669,142 | B2 | 12/2003 | Saiz |
| 6,702,552 | B1 | 3/2004 | Harman |
| 6,892,988 | B2 | 5/2005 | Hugues |
| 2004/0037986 | A1 | 2/2004 | Houston et al. |
| 2004/0238163 | A1 | 12/2004 | Harman |
| 2004/0244853 | A1 | 12/2004 | Harman |
| 2005/0269458 | A1 | 12/2005 | Harman |
| 2006/0102239 | A1 | 5/2006 | Harman |
| 2007/0003414 | A1 | 1/2007 | Harman |
| 2007/0025846 | A1 | 2/2007 | Harman |

FOREIGN PATENT DOCUMENTS

| | | |
|---|---|---|
| EP | 0 598 253 A1 | 5/1994 |
| FR | 2 534 981 | 10/1983 |
| FR | 2666031 A | 2/1992 |
| GB | 873136 | 7/1961 |
| SU | 431850 | 8/1975 |
| SU | 858896 | 12/1979 |
| WO | WO87 07048 A | 11/1987 |
| WO | WO89 08750 A | 9/1989 |
| WO | WO 00/38591 | 7/2000 |
| WO | WO 01 14782 | 3/2001 |
| WO | 03/056269 A1 | 7/2003 |
| WO | WO 03 526228 A | 7/2003 |
| WO | PCT/AU2004/001388 | 5/2005 |
| WO | 2005/073561 | 8/2005 |

OTHER PUBLICATIONS

Derwent Abstract Accession No. 97-546288/50, JP 09264462 A (Sekisui Chem Ind Co Ltd) Oct. 7, 1997.

Derwent Abstract Accession No. 1999-380417/32, JP 11148591 A (TLV Co Ltd) Jun. 2, 1999.

Derwent Abstract Accession No. E6575C/21, SU 687306A (Leningrad Forestry Acad) Sep. 28, 1977.

Derwent Abstract Accession No. N8420 E/42, SU 887876 A (As Ukr Hydromechani) Dec. 7, 1981.

Derwent Abstract Accession No. 85-073498/12, SU 1110986 A (Korolev A S) Aug. 30, 1984.

Derwent Abstract Accession No. 89-075095/10, SU 1418540 A (As Ukr Hydrodynamic) Aug. 23, 1988.

Derwent Abstract Accession No. 91-005279, SU 1560887 A (Sredaztekhenergo En) Apr. 30, 1990.

Derwent Abstract Accession No. 93-375668/47, SU 1756724 A (Odess Poly) Aug. 30, 1992.

Derwent Abstract Accession No. L0015B/47, SE 7803739 A (Ingenjorsfirma Garl) Nov. 5, 1979.

Derwent Abstract Accession No. 87-318963/45, SU 1291726 A (Makeevka Eng Cons) Feb. 23, 1987.

Derwent Abstract Accession No. 99-249047/32, JP 11072104 A (Saito Jidosha Shatai Kogyo KK) Mar. 16, 1999.

Derwent Abstract Accession No. 89-157673, SU 1437579A (Lengd Kalinin Poly) Nov. 15, 1988.

Patent Abstracts of Japan, Publication No. 2000-168632, Jun. 20, 2000, "Low Air Resistance Vehicle Body Using Vortex Ring."

Karassik et al., "Pump Handbook," published 1976 by McGraw-Hill, Inc.

Dr. Knott, Ron, "The Golden Section Ratio: Phi," Available at http://www.mcs.surrey.ac.uk/Personal/R.Knott/Fibonacci/phi.html (last accessed Oct. 3, 2006).

K. Foster et al., "Fluidics Components and Circuits," Wiley-Interscience, London, 1971, pp. 219-221.

McLarty, W., et al., "Phi Geometry: Impeller & Propeller Design for Fluids Handling," Oct. 1999, Offshore Magazine, pp. 123 (and continued).

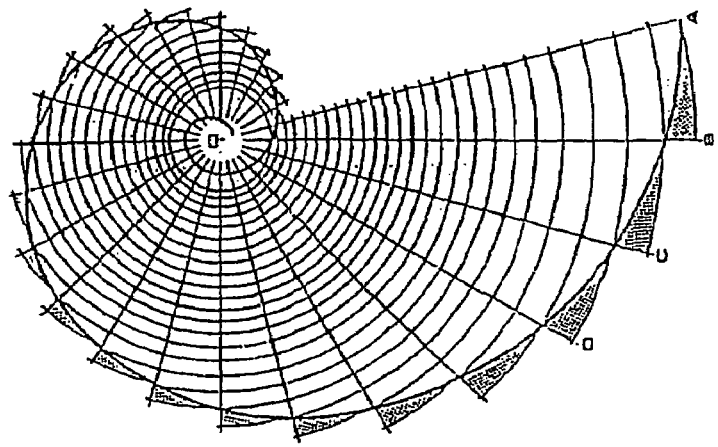
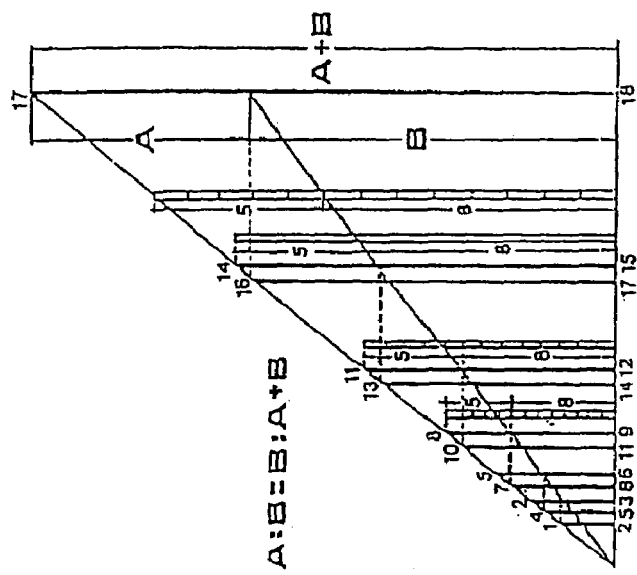
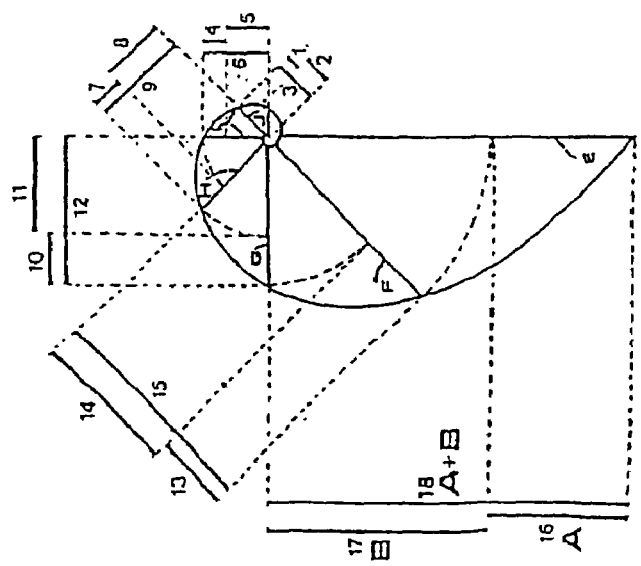

HEAT EXCHANGER

CROSS REFERENCE TO RELATED APPLICATIONS

This application is a continuation and claims the priority benefit of U.S. patent application Ser. No. 10/884,713 filed Jul. 1, 2004 and now U.S. Pat. No. 7,096,934 which is a continuation application and claims the priority benefit of Patent Cooperation Treaty Application Number PCT/AU03/00006 filed Jan. 3, 2003, and now expired, which in turn claims the priority benefit of Australian patent application number PR9825 filed Jan. 3, 2002. The disclosures of these applications are incorporated herein by reference.

BACKGROUND OF THE INVENTION

1. Field of the Invention

The present invention relates to a heat dispersing structure (heat sink or heat exchanger or radiator), which assists heat energy to be dispersed from or to a solid material and optimises the transfer of the heat energy to or from a fluid (or vice versa) surrounding the structure more efficiently than in state of the art heat sinks or thermal conductors. It may also be used where two solid or fluid plasma conductors are adjacent to each other and there is a thermal transfer required from one material to the other. Among other uses, this invention relates to heat sinks for electronic circuit boards, cooling fins for radiators, compressors and internal combustion engines, fluid carrying tubes for radiators and heat exchangers, air conditioning and refrigeration systems, plasma generators, and fluid or bimetal heat exchangers.

2. Description of the Related Art

A considerable number of structures have been devised to aid the transfer of heat energy between a solid material and a fluid. A few examples of these include heat sinks, radiant heaters, automobile radiators and air-conditioning heat exchangers. Heat sinks are commonly thought of in relation to the cooling of the solid material and comprise an array of fins associated with the solid material. The principle object of such devices has been to increase the surface area of solid material contacting the fluid to thereby increase the transfer of heat energy to the fluid. Of course, it is well known that finned arrays can also be used in heating appliances where the object is to heat a fluid. Automobile radiators are designed to disperse heat from the engine to the atmosphere by transferring heat energy from the coolant to the core of the radiator and then from the core of the radiator to the atmosphere. This latter transfer is again assisted by fins to increase surface area. Similar arrangements are found in a multitude of other applications.

Typically the design of such structures used in the transfer of heat energy between a solid and a fluid has been directed to maximising the surface area made available between the solid and the fluid. Nevertheless, the efficiency of such structures in effecting heat transfer also depends upon the flow of the fluid over the solid material. Many structures have been devised that provide considerable surface area but are not particularly efficient due to the restricted flow of the fluid past the structure. In many cases, the natural flow is supplemented by a forced fluid flow past the heat exchanger.

Nature is recognised as using the most efficient energy transfer systems known to man. Invariably, Nature propagates heat in a turbulent motion. At its most efficient, this turbulence is concentrated into a three dimensional singular vortical motion. The shape of this convectional fluid flow is expressed in equiangular logarithmic spirals, where the ratio of contraction or expansion is approximately 1:0.618, or the celebrated Golden Proportion. An example of this flow structure in a fluid is a tornado. Another example is the flame and smoke pattern arising from a fire storm. Prior technology pays little regard to such natural flow characteristics.

It has been said that nature always follows the path of least resistance. Movement and growth in nature flow in a particular specific, logarithmic geometric progression—that of the three dimensional Golden Proportion or equiangular spiral. The intention of the invention is to induce optimum energy transfer by channelling the fluids into their natural flow tendencies by full or partial adherence to Nature's equiangular, logarithmic, path of movement. The invention capitalises on natural vortical flow geometry.

Vortical structures act as 'heat pumps' (i.e. they can only exist if there is a temperature differential and vice versa). The invention seeks to exploit the exceptional cooling features of vortices. Part of their effectiveness is that vortex geometry can provide high non turbulent rates of adiabatic expansion (i.e. heat can be dumped or acquired in an optimum time and distance). The simplest, essential and most common form of a vortex is a vortex ring or toroid. (FIGS. 13 and 14).

One of the interesting and exploitable properties of a vortex ring is that is has remarkably low friction and is a rapid and highly energy efficient transporter of fluids and heat.

In order to optimise the cooling efficiency of any radiator, heat exchanger, or heat sink, it is beneficial to establish, maintain, and exploit individual vortex structures. Fluid flow, both internally and externally, may be toroid in shape, Benard cells, the shape of a convection vortex, or a potential vortex. All of the above comply approximately to the three-dimensional Golden Section or equiangular spiral.

An excellent example of this in prior technology is the Ranque-Hilsch tube. (FIG. 13). Applying the design criteria of the embodiments of this invention, wholly or in part, will improve performance of existing thermal conductor structures.

SUMMARY OF THE INVENTION

An embodiment of the present invention provides for a heat exchanger including a base. The base of the heat exchanger is configured to be coupled to a thermal energy source. The heat exchanger also includes a remote end and a vane. The vane extends from the base to the remote end and includes an active surface. The active surface of this embodiment conforms in two dimensions to an equiangular logarithmic spiral.

Another embodiment of the present invention provides for a heat exchanger including a solid block of material. That block of material includes a plurality of vents, each vent including a vane. Each vane has an active surface that conforms in two dimensions to an equiangular logarithmic spiral.

A still further embodiment of the present invention provides for a heat exchanger including a tank. The tank includes a front and real wall in addition to a plurality of vanes disposed from the front wall to the rear wall. Each of the vanes has an active surface confirming in two dimensions to an equiangular logarithmic spiral.

In yet another embodiment of the present invention, a heat exchanger including a tank is provided. The tank includes a front and real wall with a plurality of vents disposed from the front wall to the rear wall. Each of the vents includes a vane that has an active surface conforming in two dimensions to an equiangular logarithmic spiral.

BRIEF DESCRIPTION OF THE DRAWINGS

FIG. 1 is a chart of the Golden Section or Fibonacci Progression;

DETAILED DESCRIPTION

Figure 3:
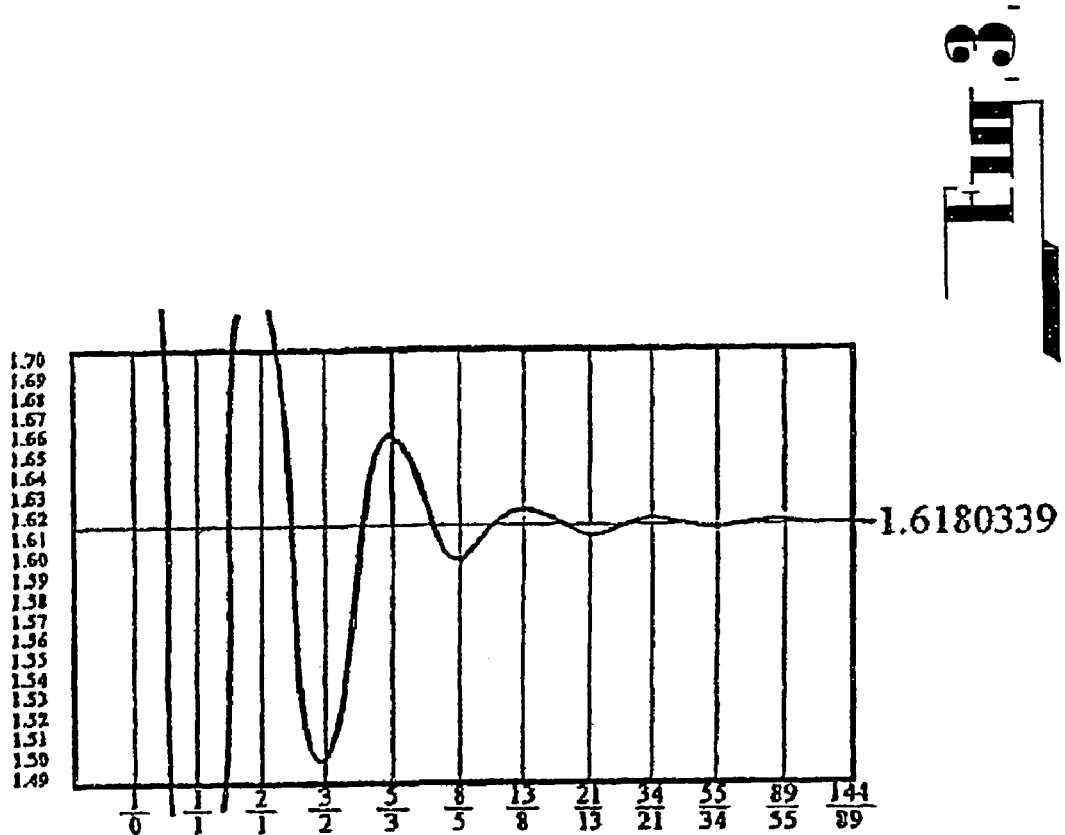
FIG. 3 is a graph depicting the geometric progression ratio of the structure of a Golden Section vortex.
Figure 2:
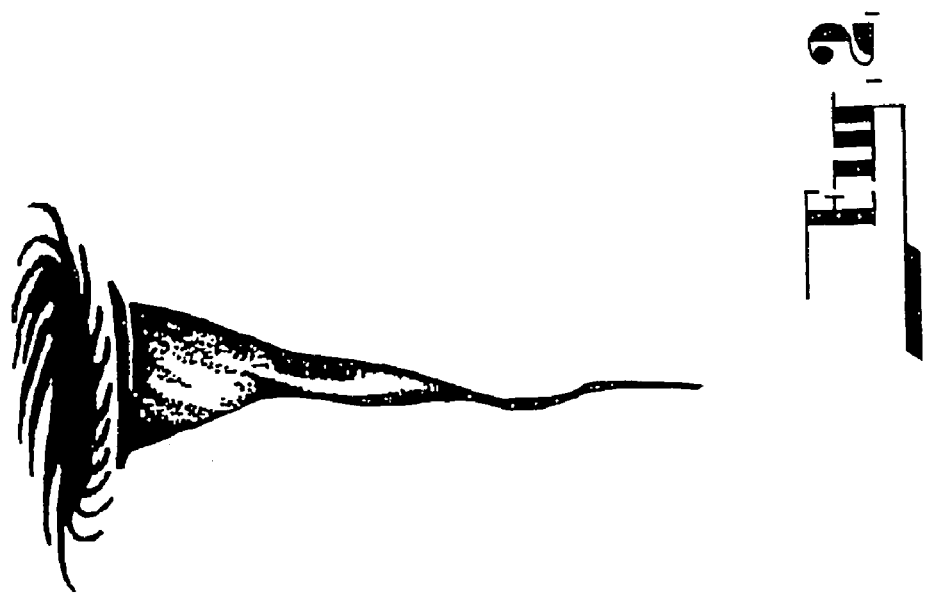
FIG. 2 is a schematic side view of a natural vortex which conforms to the Golden Section.
Figure 4:
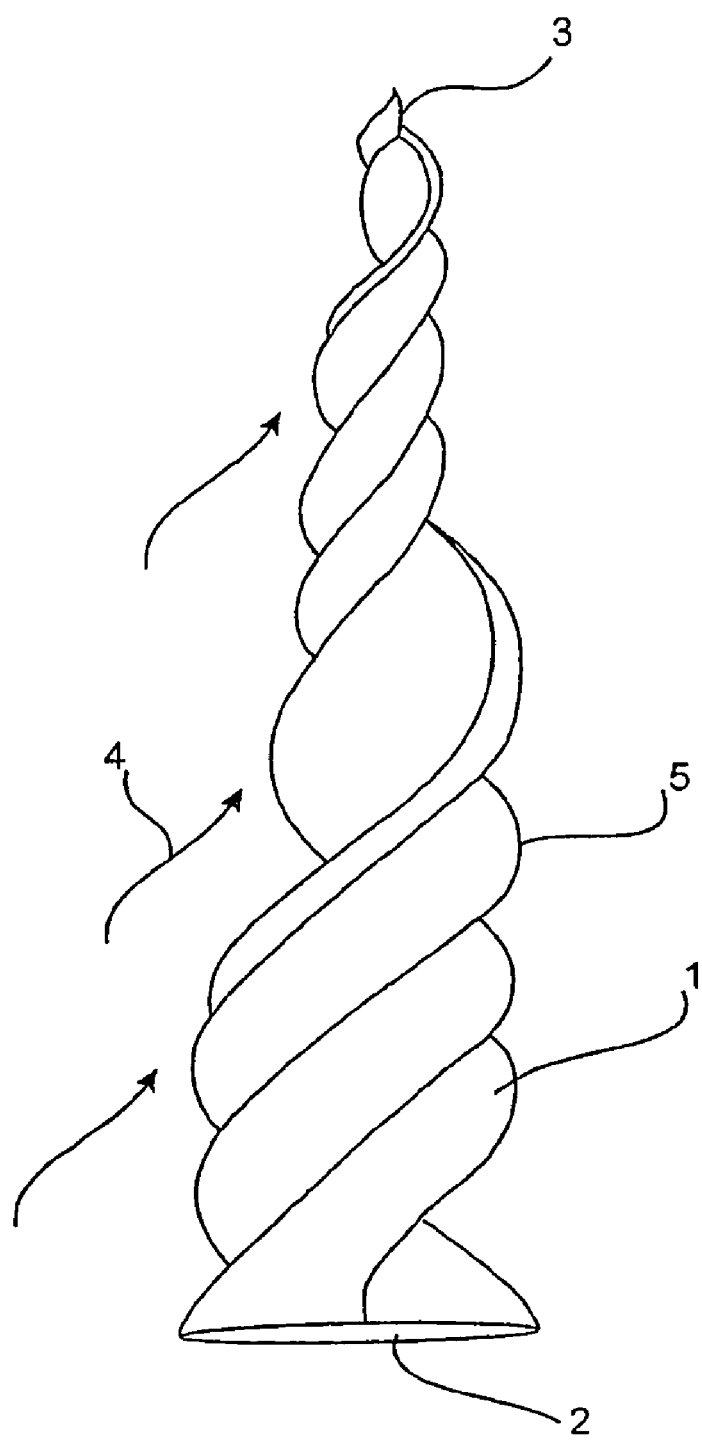
FIG. 4 is a side elevation of a heat exchanger according to a first embodiment of the invention.
Figure 5:
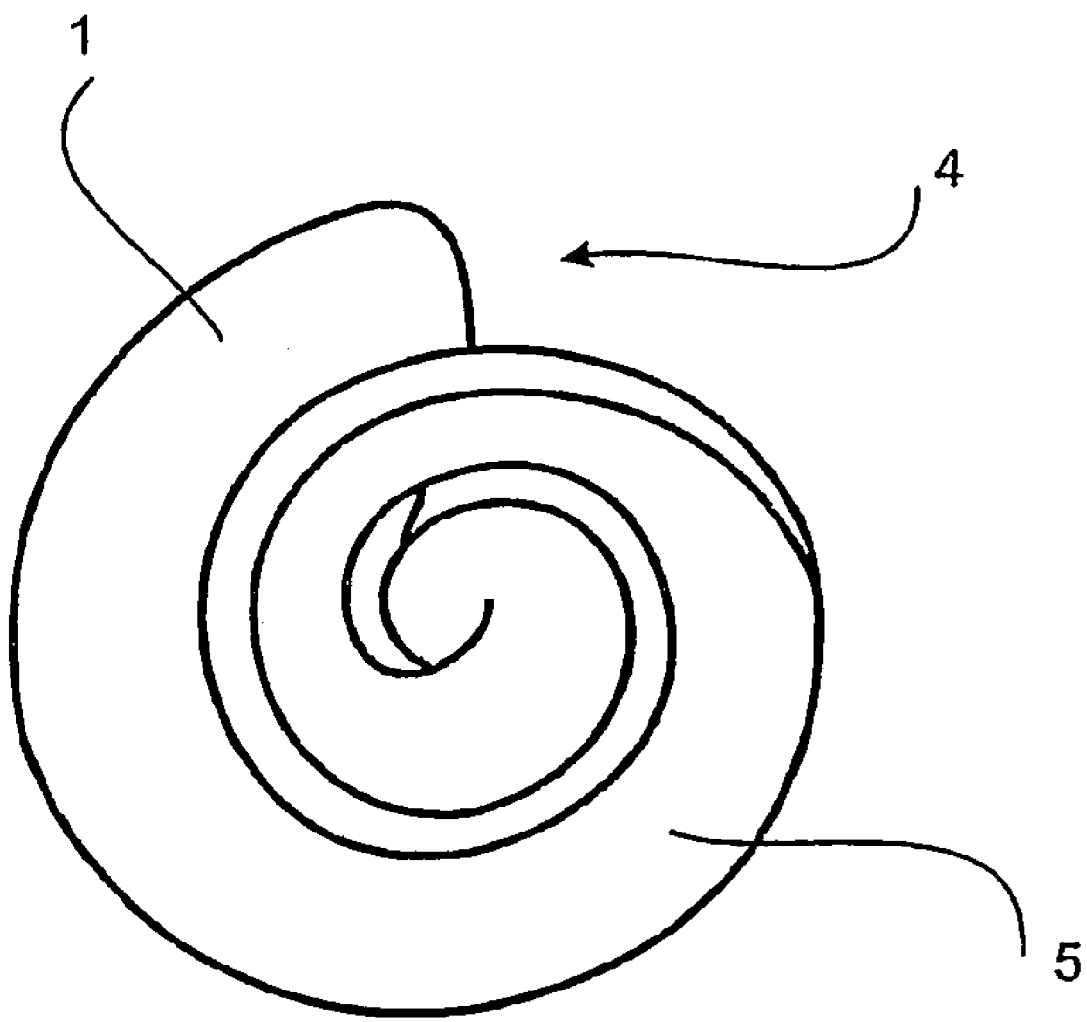
FIG. 5 is an end view of the heat exchanger of the first embodiment as shown in FIG. 4.
Figure 6:
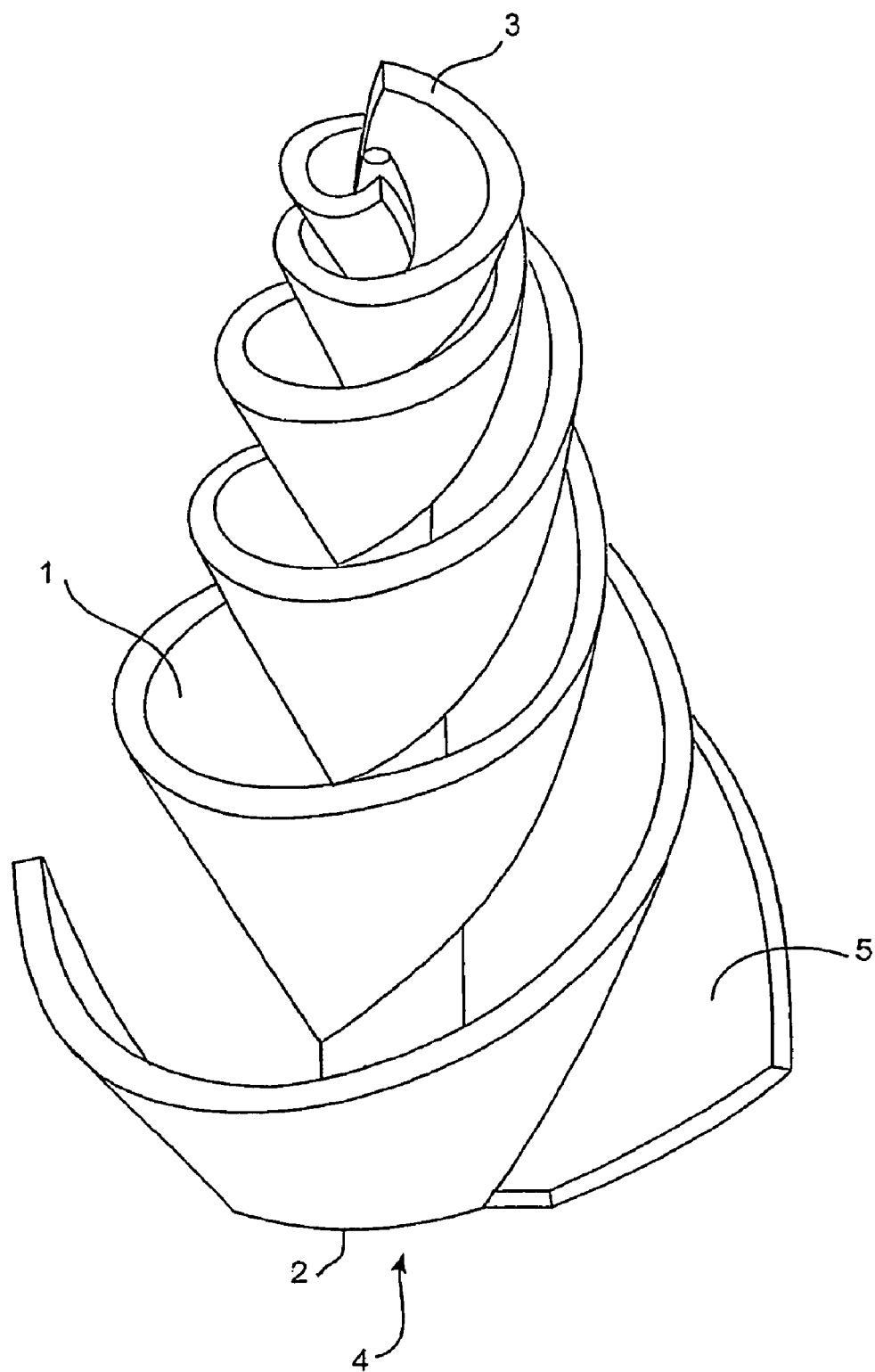
FIG. 6 is a side elevation of a heat exchanger according to a second embodiment.
Figure 7:
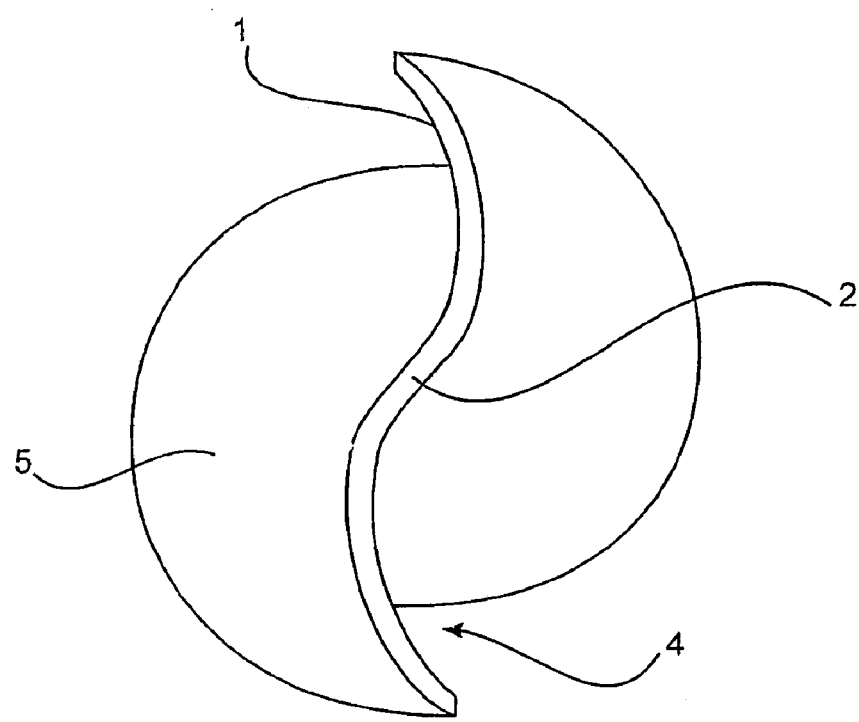
FIG. 7 is an end elevation of the heat exchanger of the second embodiment as shown in FIG. 6.
Figure 9:
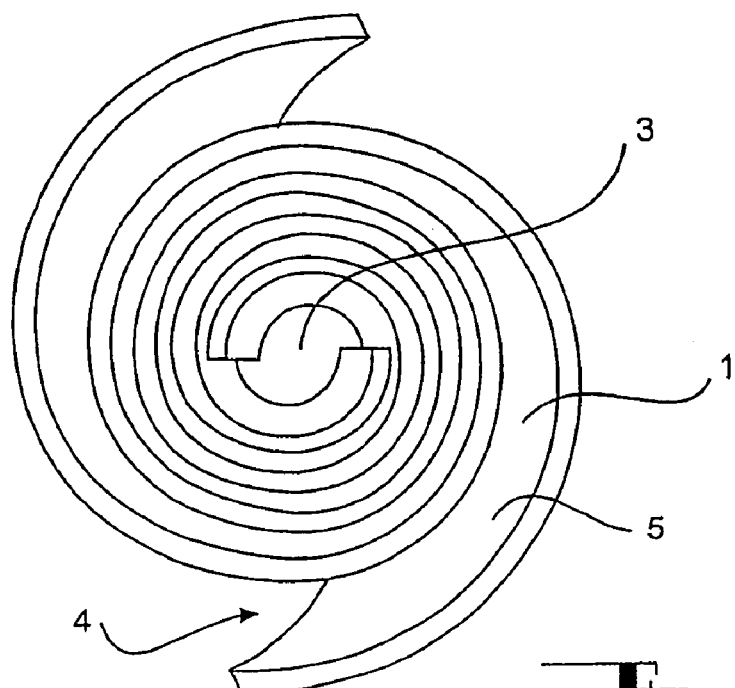
FIG. 9 is an end elevation of the heat exchanger of the third embodiment as shown in FIG. 8.
Figure 8:
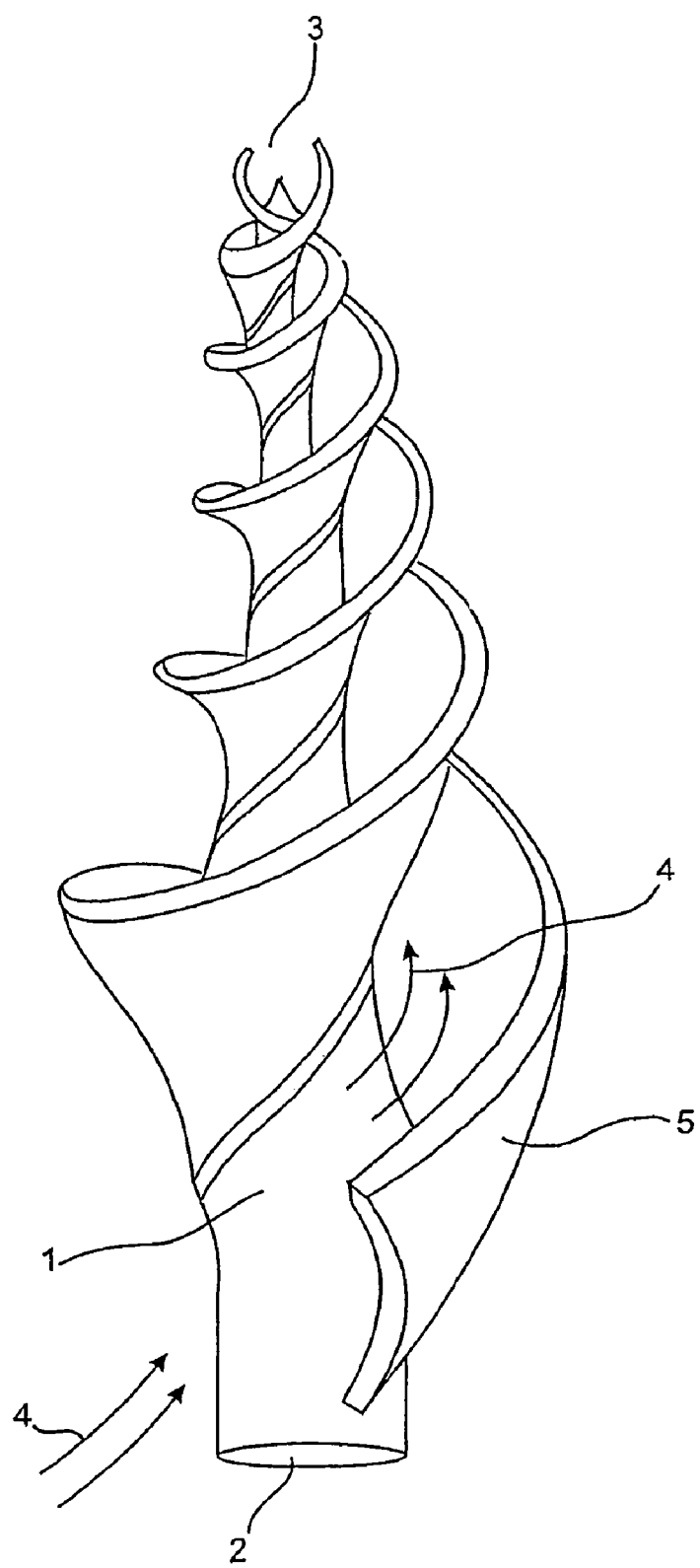
FIG. 8 is a side elevation of a heat exchanger according to a third embodiment.
Figure 10:
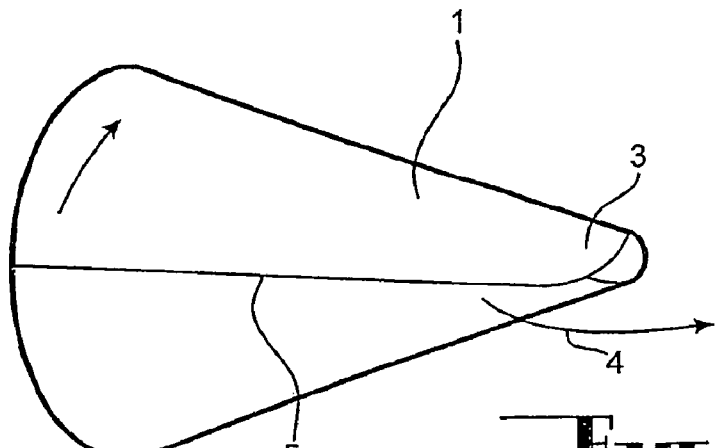
FIG. 10 is a side view of a fourth embodiment of a heat exchanger according the invention.
Figure 11:
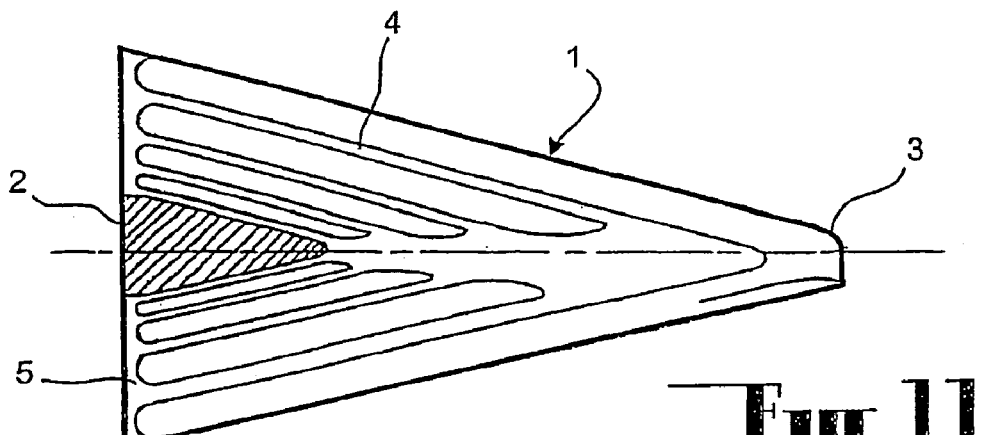
FIG. 11 is a sectional side view of the fourth embodiment.
Figure 12:
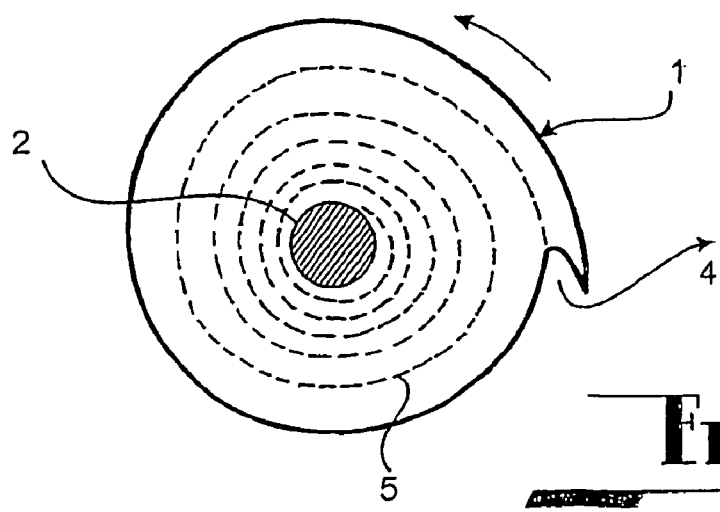
FIG. 12 is an end elevation of the fourth embodiment.

Each of the embodiments is directed to a heat exchanger which is adapted to affect the transfer of heat between a solid surface and a fluid.

As stated previously all fluids when moving under the influence of the natural forces of Nature, tend to move in spirals or vortices. These spirals or vortices generally comply to a mathematical progression known as the Golden Section or the Fibonacci Progression. Each of the embodiments serves to enable fluids to move in their naturally preferred way, thereby reducing inefficiencies created through turbulence and friction which are normally found in apparatus commonly used in such heat exchangers. Previously developed technologies have generally been less compliant with natural fluid flow tendencies.

The heat exchangers of each of the embodiments described herein are generally designed in all respects, in accordance with the Golden Section and therefore it is a characteristic of each of the embodiments that the heat exchanger provides a fluid pathway which is of a spiraling configuration and which conforms at least generally to the characteristics of the Golden Section. The characteristics of the Golden Section are illustrated in FIG. 1 which illustrates the unfolding of the spiral curve according to the Golden Section. As the spiral unfolds the order of growth of the radius of the curve which is measured at equiangular radii (e.g. E, F, G, H, I and J) is constant. This can be illustrated from the triangular representation of each radius between each sequence which corresponds to the formula of a:b=b: a+b which conforms to the ratio of 1:0.618 and which is consistent through out the curve.

It is a characteristic of each of the embodiments that the curvature of the surfaces which form the heat exchanger takes a two dimensional or three dimensional shape and which substantially conform to the characteristics of the Golden Section and that any variation in cross-sectional area of the fluid pathway also substantially conforms to the characteristics of the Golden Section. Furthermore it has been found that the characteristics of the Golden Section are found in nature in the form of the external and internal configurations of shells of the phylum Mollusca, classes Gastropoda and Cephalopoda and it is a common characteristic of at least some of the embodiments that the fluid pathway defined by the heat exchangers corresponds generally to the external or internal configuration of shells of one or more of the genera of the phylum Mollusca, classes Gastropoda and Cephalopoda.

It has been found that it is a characteristic of fluid flow that, when it is caused to undergo a fluid flow through a pathway having a curvature substantially conforming to that of the Golden Section that the fluid flow over the surfaces is substantially non-turbulent and as a result has a decreased tendency to cavitate. As a result, fluid flow over the surface is more efficient than has been encountered in previous instances where the pathway does not substantially correspond to that of the Golden Section. As a result of the reduced degree of turbulence which is induced in the fluid in its passageway through such a pathway, the heat exchangers according to the various embodiments transfer heat between the solid material and the fluid with a greater efficiency than has previously been possible with conventional heat exchangers of equivalent dimensional characteristics. Fluid flow over the surface is streamlined and all of the fluid flows. The configuration avoids dead pockets of "stagnant" fluid, which is a common problem with conventional systems.

The FIGS. 4, 5, 6, 7, 8, 9, 10, 11, and 12 illustrates various embodiments of heat exchangers in accordance with the invention. While each of the embodiments has a different appearance, they each share features common to their operation as a heat sink. Therefore, in the drawings, like numerals are used to depict like features.

In each embodiment, the heat exchanger has an active surface which shaped in a similar manner to the cavitation centre of a vortex or to the centre windings or septa of a volute, cone or other sea shell. Each embodiment has a base 2 which is adapted to be attached to a thermal energy source to extend therefrom. As heat is transmitted to the fluid flowing over the active surface of the device from the base (2), the fluid accelerates towards the remote end of the device and as the fluid accelerates, it cools adiabatically which serves to maintain a temperature differential between the active surface of the heat exchanger and the fluid to facilitate further heat exchange.

The active surface (1) may comprise a single vane or rib, as shown in FIGS. 6, 7, 10, 11 and 12 or alternatively may comprise multiple vanes. The heat exchanger (1) may also increase or decrease in profile width (FIGS. 6 and 8 in comparison with FIG. 4) in full or partial conformance with the Golden Section depending on desired application. The vanes may be solid, hollow, or represent a vortex shaped void as in FIGS. 14 and 16.

Heat exchangers according to the invention may be used in a wide variety of applications. For example heat sinks designed in accordance with the embodiments depicted in FIGS. 4, 6 and 8 may be adapted to provide cooling to a wide range of heat sources such as semiconductors, power transformers, refrigeration, and heating appliances, to name a few.

In such applications, a more efficient heat transfer is affected by the establishment of a vortical fluid flow over the surfaces of the heat exchangers. This efficient fluid flow means that more efficient and effective use is made of the heat exchanger which may therefore be smaller than conventional designs.

As indicated earlier, beyond the benefit of improving fluid flow across the surfaces of a heat exchanger, the present invention also offers a further mechanism to effect a temperature differential across a body. In the embodiments as shown in FIGS. 4 to 12, when fluid enters the system at the base 2, it is rapidly accelerated radially in to movement toward the remote end 3 to attain a maximum speed and minimum pressure. As a result, the temperature of the fluid is reduced adiabatically, causing a temperature differential across the vortex. This temperature differential is inherent within a vortical flow. By suitable design, a body may be constructed to take advantage of this differential.

Figure 13:
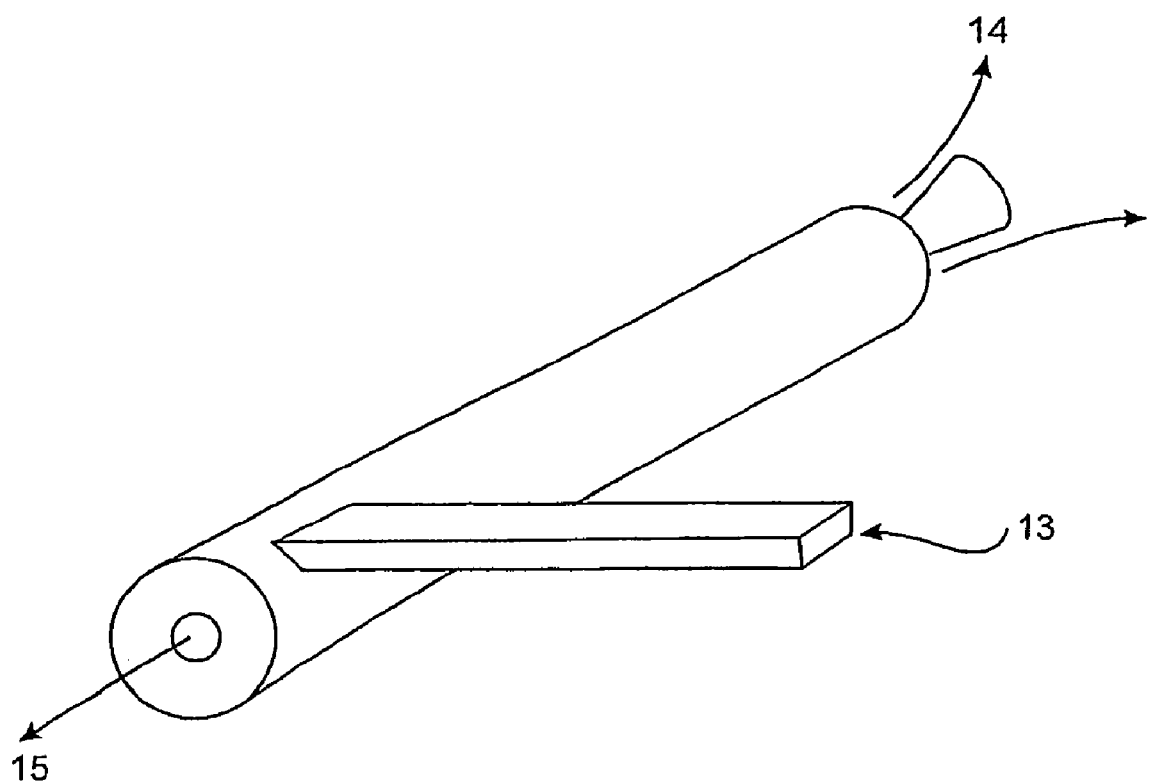
FIG. 13 is a schematic view of a Ranque-Hillsch tube.
Figure 14:
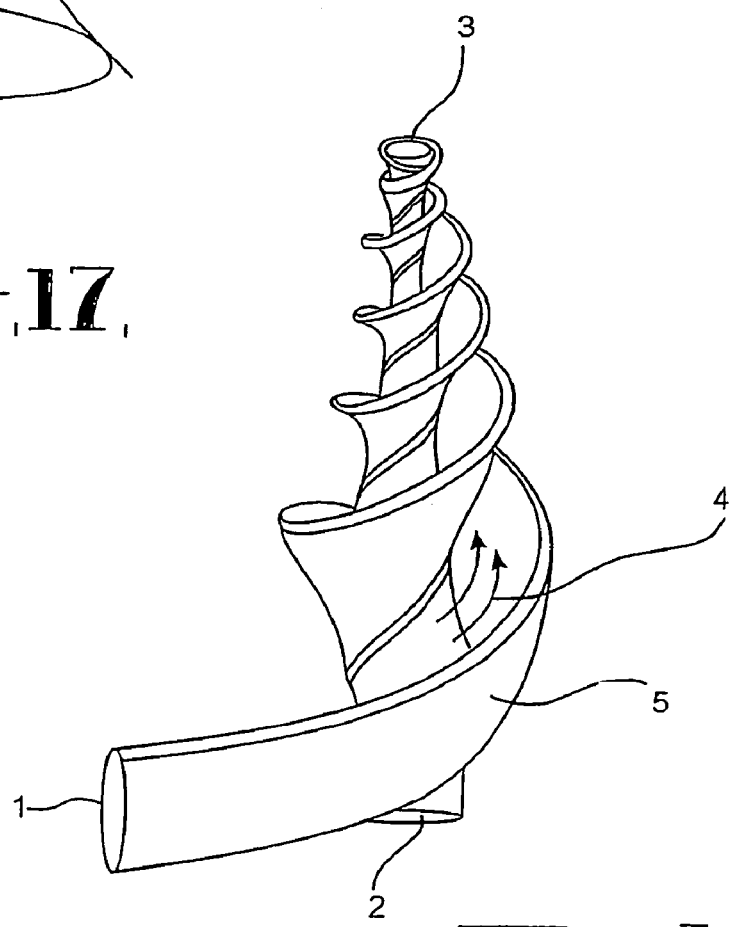
FIG. 14 is schematic view of a refrigerating device according to the fifth embodiment.

FIG. 13, illustrates a Ranque-Hilsch tube in which compressed air enters a tube tangentially at 13. A temperature differential is created radially across the tube with the fluid at the central axis being cooler. In addition, the flow of fluid along the tube at the centre is opposite to that of the perimeter. Therefore, cold air exits at one end 14 hot air exits at the other end 15 as a result of the Ranque effect. Temperatures of −50 degrees Celsius are readily attainable in these mechanisms. These devices are not presently very energy efficient. Although they are seeking to capitalize on vortical temperature differentials they have not yet been designed according to Phi vortical geometry. As a result, considerable energy is consumed through turbulence and friction which is generated internally. The fifth embodiment as shown at FIG. 14 comprises a refrigeration device similar to a Ranque-Hilsch tube which is designed in accordance with the invention. However, it does not use a parallel-sided pipe as shown in FIG. 13 but will be a hollow version of one of the embodiments as shown in FIGS. 4 to 12 where all surfaces approximate three-dimensional curves according to the Golden Section. Gas is admitted to a hollow spiralling vane 5 through inlet 1 and flows to outlet 3. En-route, it accelerates and experiences a pressure drop with a consequent temperature drop as in a Ranque-Hilsch tube. Hot air is expelled through outlet 2 and cold air is delivered through outlet 3.

When such devices are redesigned in accordance with the principles of the present invention, significant efficiency gains are achieved.

Figure 15:
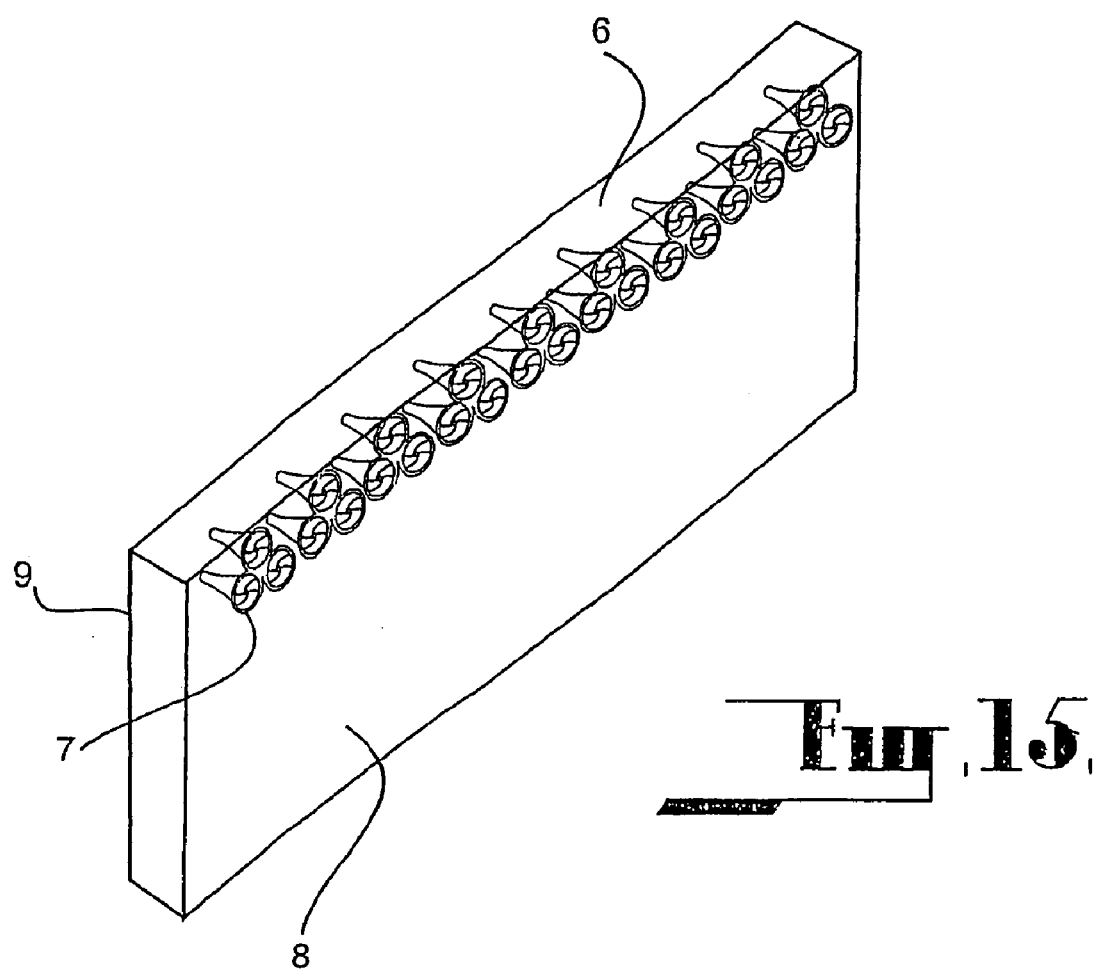
FIG. 15 is a schematic view of a cooling radiator for internal combustion engines and refrigeration systems.
Figure 16:
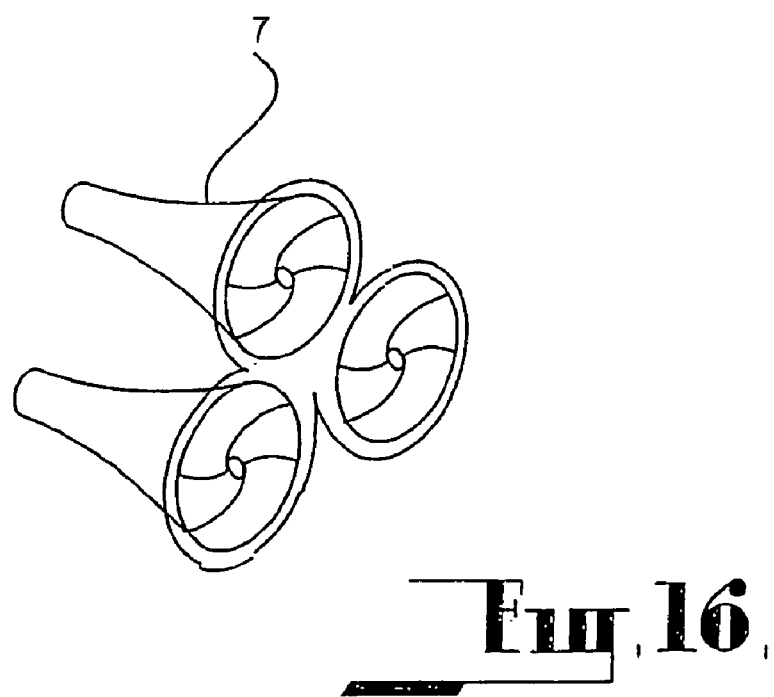
FIG. 16 is a close up schematic view of vanes of one form of the invention as they would appear in the radiator of FIGS. 14 and 15.
Figure 17:
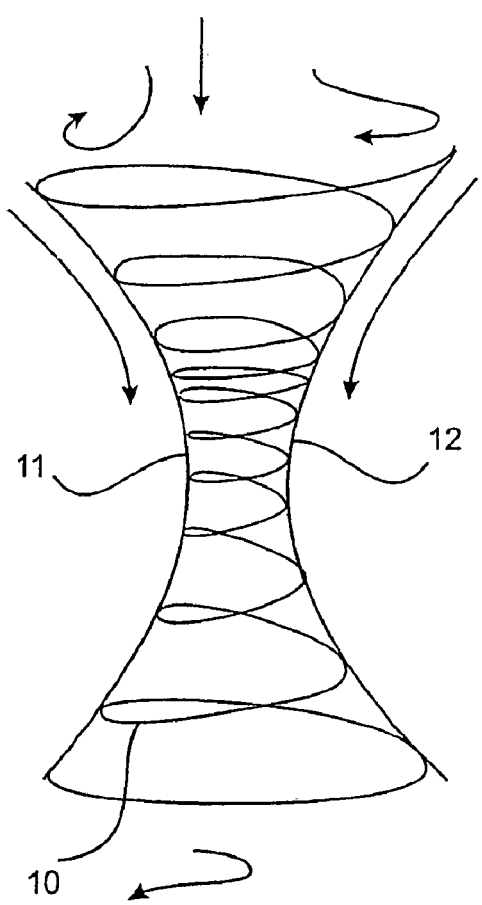
FIG. 17 is a schematic view of the centre of a vortex ring showing the mode of vortical flow of fluid or heat energy.

FIGS. 15 and 16 depict a tank of liquid or gas through which vanes or vents (7) are passed and attached to front and rear walls so that another fluid medium may travel through the tank via the vanes. Alternatively (6) may be a solid block of material such as metal through which vents (7) are cut. The vanes or vents in FIGS. 14 and 15 may be shaped like an hourglass as in FIG. 16, in conformity with the principles described above. The passage of fluid through vents (7) creates a temperature differential between one side (8) of the tank or block (6) and the opposed side (9), thereby causing a heat interchange across the block.

It should be appreciated that the scope of the present invention need not be limited to the particular scope of the embodiments described above.

Throughout the specification, unless the context requires otherwise, the word "comprise" or variations such as "comprises" or "comprising", will be understood to imply the inclusion of a stated integer or group of integers but not the exclusion of any other integer or group of integers.

What is claimed is:

1. A heat exchanger comprising:
   a base configured to be coupled to a thermal energy source;
   a remote end; and
   a vane extending from the base to the remote end and including an active surface, the active surface substantially conforming in at least one dimension to a logarithmic spiral, wherein the radius of the logarithmic spiral when measured at equiangular radii unfolds at a constant order of growth, and wherein heat generated by the thermal energy source is transmitted to a fluid, the fluid flowing from the base to the remote end and over at least a portion of the active surface of the vane.

2. The heat exchanger of claim 1, wherein the active surface further substantially conforms in a second dimension to a logarithmic spiral, wherein the radius of the logarithmic spiral when measured at equiangular radii in the second dimension unfolds at a constant order of growth.

3. The heat exchanger of claim 1 further comprising a second vane extending from the base to the remote end and including an active surface that substantially conforms in at least one dimension to a logarithmic spiral, wherein the radius of the logarithmic spiral when measured at equiangular radii unfolds at a constant order of growth and wherein heat generated by the thermal energy source is transmitted to the fluid flowing from the base to the remote end and further over at least a portion of the active surface of the second vane.

4. The heat exchanger of claim 1, wherein a profile width of the vane increases as the vane extends from the base.

5. The heat exchanger of claim 1, wherein a profile width of the vane decreases as the vane extends from the base.

6. The heat exchanger of claim 1, wherein the vane is hollow.

7. The heat exchanger of claim 1, wherein the vane is solid.

8. The heat exchanger of claim 1, wherein the vane includes a vortex-shaped void.

9. The heat exchanger of claim 1, wherein the vane further includes a second active surface.

10. The heat exchanger of claim 9, wherein the second active surface substantially conforms in at least one dimension to a logarithmic spiral, wherein the radius of the logarithmic spiral when measured at equiangular radii unfolds at a constant order of growth, and wherein heat generated by the thermal energy source is transmitted to the fluid, the fluid flowing from the base to the remote end and further over at least a portion of the second active surface of the vane.

11. A heat exchanger comprising:
    a base configure to be coupled to a thermal energy source;
    a remote end; and
    a vane extending from the base to the remote end and including an active surface, wherein the active surface substantially conforms to the external configuration of a shell of the phylum *Mollusca*, class Gastropda or Cephalopoda, and wherein heat generated by the thermal energy source is transmitted to a fluid, the fluid flowing from the base to the remote end and over at least a portion of the active surface of the vane.

12. A heat exchanger comprising:
    base configured to be coupled to a the energy source;
    a remote end; and a vane extending from the base to the remote end and including an active surface, wherein the active surface substantially conforms to the external configuration of a shell of the genera *Volutidea, Argonauta, Nautilus, Conidea*, or *Turbinidea*, and wherein heat generated by the thermal energy source is transmitted to a fluid, the fluid flowing from the base to the remote end and over at least a portion of the active surface of the vane.

13. A heat exchanger comprising:

a base configured to be coupled to a thermal energy source;

a remote end; and a vane extending from the base to the remote end and including an active surface, wherein the active surface substantially conforms to the internal configuration of a shell of the phylum *Mollusca*, class Gastropda or Cephalopoda, and wherein heat generated by the thermal energy source is transmitted to a fluid, the fluid flowing from the base to the remote end and over at least a portion of the active surface of the vane.

14. A heat exchanger comprising:

a base configured to be coupled to a thermal energy source;

a remote end; and a vane extending from the base to the remote end and including an active surface, wherein the active surface substantially conforms to the internal configuration of a shell of the genera *Volutidea, Argonauta, Nautilus, Conidea*, or *Turbinidea*, and wherein heat generated by the thermal energy source is transmitted to a fluid, the fluid flowing from the base to the remote end and over at least a portion of the active surface of the vane.

15. A heat exchanger comprising:

a base configured to be coupled to a thermal energy source;

remote end; and a vane extending from the base to the remote end and inducing an active surface, wherein the active surface substantially conforms to the configuration of a whorl, and wherein heat generated by the thermal energy source is transmitted to a fluid, the fluid flowing from the base to the remote end and over at least a portion of the active surface of the vane.

16. A heat transfer method, comprising:

generating a fluid flow;

directing the fluid flow from a first point to a second point, wherein the first point receives heat generated by a thermal energy source and the second point is characterized by having a temperature less than that of the first point receiving the heat generated by the thermal energy source;

providing a heat exchanger in a flow path between the first point and the second point, wherein the heat exchanger includes a vane extending from a base of the heat exchanger and that is proximate to the first point to a remote end of the heat exchanger that is proximate the second point the vane including an active surface substantially conforming in at least one dimension to a logarithmic spiral, wherein the radius of the logarithmic spiral when measured at equiangular radii unfolds at a constant order of growth; and transferring at least a portion of the thermal energy received at the first point to the second point irk the heat exchanger as the fluid flow is directed from the base to the remote end of the heat exchanger and over at Least a portion of the active surface of the vane.

* * * * *